United States Patent [19]
Merkle et al.

[11] Patent Number: 6,093,054
[45] Date of Patent: Jul. 25, 2000

[54] CONNECTOR FOR CONNECTING A PRINTED CIRCUIT BOARD TO A FLAT FLEXIBLE CIRCUIT

[75] Inventors: Klaus Merkle, Bretten; Helmut Zischka, Flacht, both of Germany

[73] Assignee: Molex Incorporated, Lisle, Ill.

[21] Appl. No.: 09/131,034

[22] Filed: Aug. 7, 1998

[30] Foreign Application Priority Data

Aug. 7, 1997 [DE] Germany ................ 297 13 988 U

[51] Int. Cl.7 ........................................... H01R 12/24
[52] U.S. Cl. ........................................... 439/493
[58] Field of Search ................ 439/493, 495, 439/67, 496, 77

[56] References Cited

U.S. PATENT DOCUMENTS

| | | | |
|---|---|---|---|
| 4,023,877 | 5/1977 | Hennessey et al. | 439/67 |
| 4,111,510 | 10/1978 | Zurcher | 439/67 |
| 4,531,793 | 7/1985 | Hochgesang | 439/67 |
| 5,525,072 | 6/1996 | Kunishi | 439/495 |
| 5,529,502 | 6/1996 | Peltier et al. | 439/67 |
| 5,616,050 | 4/1997 | Suski | 439/495 |
| 5,752,851 | 5/1998 | Zaderej et al. | 439/493 |
| 5,928,027 | 7/1999 | Kunishi | 439/495 |

*Primary Examiner*—Gary F. Paumen
*Assistant Examiner*—Briggitte Hammond
*Attorney, Agent, or Firm*—Stacey E. Caldwell

[57] ABSTRACT

A connector assembly for connecting a rigid circuit board to a flat flexible circuit. The connector includes a U-shaped contact element, U-shaped compression spring and U-shaped housing. The housing is dimensioned to receive the circuit board at an edge thereof and includes a receptacle for the flexible circuit. The contact element is mounted in the housing and is in contact with a contact surface of the circuit board and a contact surface of the flexible circuit. The housing includes openings through which a respective contact arm of the contact element extends to contact the circuit board. The compression spring includes pressing surfaces which exert a pressing force against the flexible circuit to effect contact between the flexible circuit and the contact element.

10 Claims, 4 Drawing Sheets

CONNECTOR FOR CONNECTING A PRINTED CIRCUIT BOARD TO A FLAT FLEXIBLE CIRCUIT

FIELD OF THE INVENTION

This invention generally relates to a connector for connecting a printed circuit board to a flat flexible circuit.

BACKGROUND OF THE INVENTION

In the field of electronics and, specifically, of motor vehicle electrical systems, there is an increasing requirement for connections between rigid printed circuit boards and flexible cables such as flat flexible circuits (or "FFCs"). Since relatively complex circuits are now constructed on flexible materials, their connection to conventional printed circuit boards has become increasingly more important.

Such connections have heretofore been effected by soldering, particularly in the case of known FFC constructions using polyimide as the flexible support material, and copper as the conductive material. Furthermore, since the conductive traces on the FFC consist of solid metal, i.e. copper, other known connection technologies, such as plug and screw contacts, can also be utilized in applications where additional mechanical stability is required.

However, other support materials are being used to an increasing extent, such as polyethylene terephthalate, and other conductive materials have been used, such as silver grains embedded in an epoxide. Although the layers of such conductive materials can have thicknesses of 5–10 mm, they do not have the strength of conventional copper conductive material, which may be needed in some applications. Furthermore, these conductive materials are thermally and mechanically sensitive, and therefore different solutions may be required for their connection to printed circuits. In particular, the reliability of these connections in the automobile industry, in relation to mechanical loadability, vibration and corrosion resistance, for example is of utmost importance.

SUMMARY OF THE INVENTION

The subject invention, therefore, has as its object to provide a robust, and in particular vibration-insensitive and mechanically durable, connection between a printed circuit board and a flat flexible circuit in which good electrical contact is provided between the circuit board and the flexible circuit without the use of soldering or crimping.

According to the invention, a connector assembly is provided which comprises a substantially U-shaped contact element arranged between the flexible circuit and the circuit board and in contact with a connection surface of the circuit board and a connection surface of the flexible circuit. The contact element is mounted within a housing which surrounds the circuit board at an edge thereof in a U-shape. The housing includes at least one passage through which a first arm of the contact element extends to contact the circuit board. A mechanically strong and vibration-insensitive mounting of the connector housing is provided by this arrangement, and short conductive paths between the circuit board and the flexible circuit are made possible.

The contact element is easily assembled onto the housing of the connector and is secured in position in the housing by an inwardly-directed latching tongue formed on the second arm of the contact element.

The first arm of the contact element is preloaded or prestressed and therefore contact pressure on the circuit board is independently exerted, and is therefore sufficient in many applications to effect an electrical connection without the costs associated with secondary soldering processes. By avoiding these processes, unfavorable temperature effects on the flexible circuit, such as can arise during reflow or wave soldering, are prevented, and mechanical damage which can arise in crimping or screwing for example is likewise avoided. The connector assembly further includes a compression spring which produces a defined pressing force between the flexible circuit and the contact element. The compression spring secures the flexible circuit around the outer periphery of the U-shaped contact element such that bilateral pressing forces of the spring insure that one side of the contact element remains in contact with the flexible circuit even in the presence of mechanical vibration or impact when the impact effect exceeds the preload of the compression spring. External environmental influences such as vibrations or mechanical impacts can be effectively minimized by appropriate dimensioning of the compression spring, so that intermittencies are avoided. The contact element and the compression spring are constructed so that at least two contact points are produced between the flexible circuit and the contact element. In one embodiment, more than two contact points are produced by depressions or recesses in the contact element and by additional contact between a backside of the compression spring and the flexible circuit. Another embodiment provides more than two contact points between the flexible circuit and the contact element by means of the shape of the compression spring.

The assembly and handling of the connector are facilitated by latching the compression spring onto the housing in a preassembled position, from which the compression spring can be easily moved to its final mounted position. For this purpose, corresponding depressions associated with the spring are arranged on both sides of the connector housing.

The insertion of the flexible circuit into the housing is facilitated by a funnel-shaped insertion channel, defined by the compression spring in its preassembled position.

A securing rib is formed on the connector housing and engages a recess of the compression spring. The rib extends in the direction of movement of the compression spring from its preassembled position into its final mounted position and reduces vibration and movement of the compression spring, therefore minimizing the introduction of unnecessary forces into the connector housing. The same result can be attained with a lateral recess formed in the connector housing, whereby the recess extends in the direction of movement of the compression spring and a lateral lug of the compression spring extends into the recess.

A flexible circuit strain relief may be provided by means of a tongue arranged on an arm of the contact element and which engages, in the final mounted position of the compression spring, an associated recess formed in the flexible circuit. The dimensioning of the tongue produces defined holding forces, in relation to the compression force exerted by the compression spring, greater than the mechanical forces which arise in everyday operation, but which release the flexible circuit before damage occurs.

Finally, a tongue formed on the connector housing engages associated openings in the compression spring and therefore holds the spring in its final mounted position. This arrangement is particularly useful in connectors subject to high mechanical or vibration loading, such as in knock sensors in the motor vehicle field.

Other objects, features and advantages of the invention will be apparent from the following detailed description taken in conjunction with the accompanying drawings.

BRIEF DESCRIPTION OF THE DRAWINGS

The invention is described in more detail herein below with reference to preferred embodiments and to the accompanying drawings, in which like reference numerals identify like elements in the figures and in which.

DETAILED DESCRIPTION OF THE PREFERRED EMBODIMENT

Figure 1:
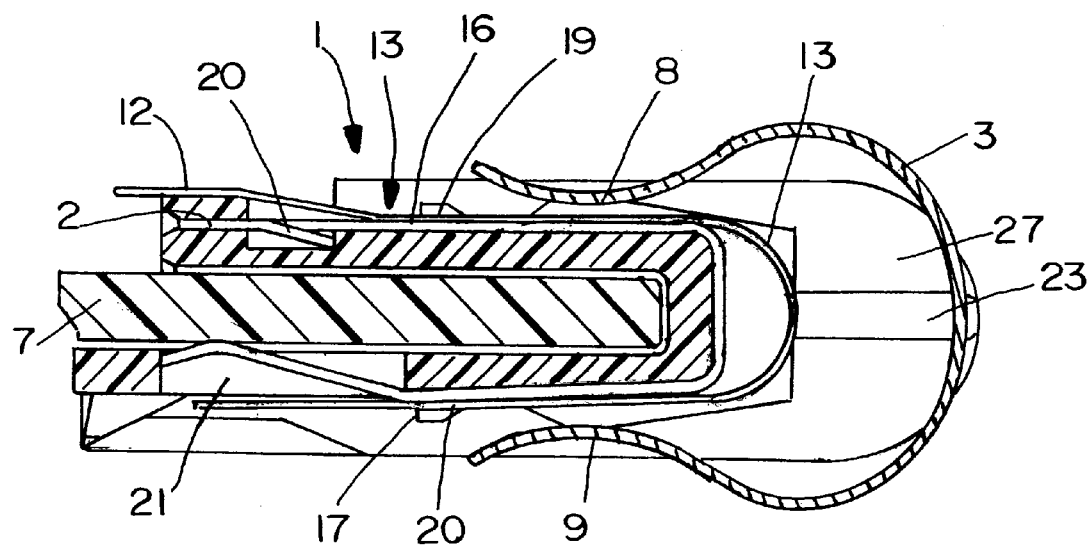
FIG. 1 is a cross section of a first embodiment of the connector according to the invention taken along line B—B of FIG. 6, showing the compression spring in its preassembled position.
Figure 6:
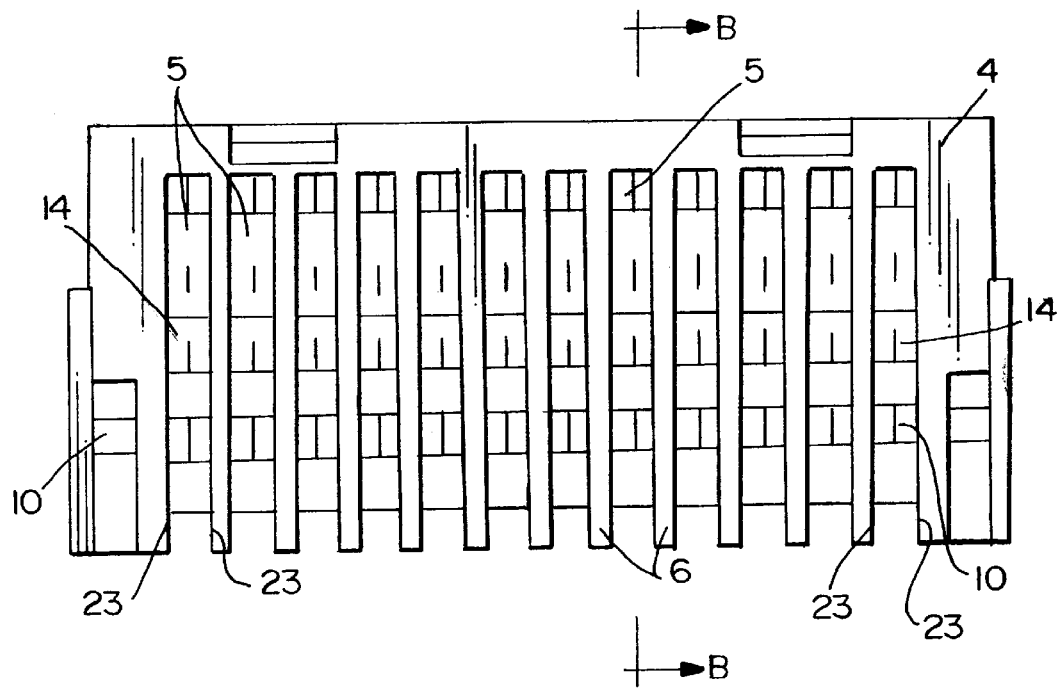
FIG. 6 is a view of a second embodiment of the connector housing of the invention showing vibration-suppressing devices, without the compression spring and without the flexible circuit.

Referring first to FIG. 1 in conjunction with FIG. 6, the invention is embodied in an electrical connector assembly 1 adapted to provide a connection between a printed circuit board 7 and a flat flexible circuit 12 ("FFC"). The connector includes a substantially U-shaped contact element 2, a substantially U-shaped compression spring 3 and a substantially U-shaped housing 4. The housing includes a plurality of cavities 5 which extend substantially parallel and open toward an exterior of the housing. A plurality of ribs 6 extend slightly beyond the floor of cavities 5 and are positioned between the cavities.

Figure 2:
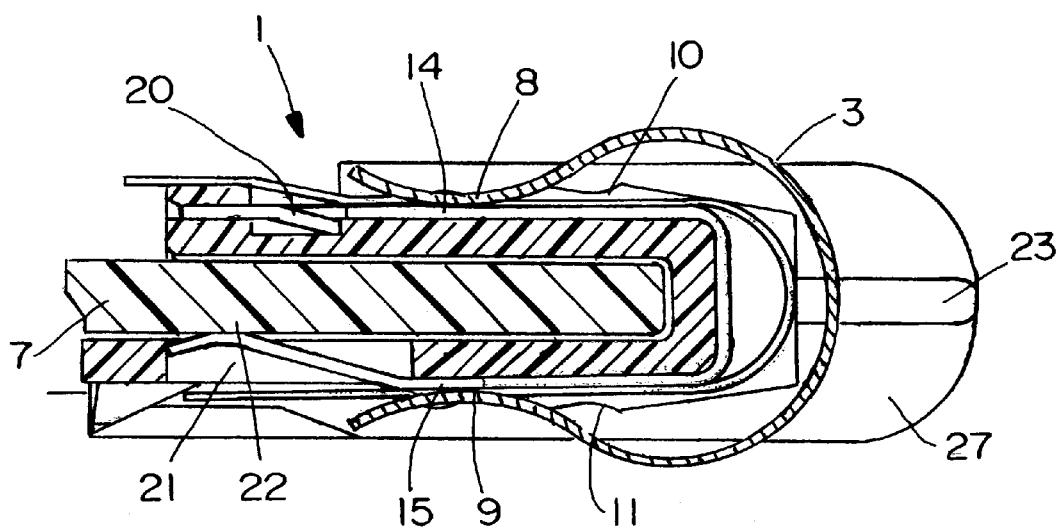
FIG. 2 is a cross section of a first embodiment of the connector according to the invention taken along the line B—B of FIG. 6, showing the compression spring in its mounted position.

The compression spring 3 is adapted to be mounted onto housing 4 and is located within each cavity 5 between two guide ribs 27 (FIG. 5) extending from the ends of housing 4. Compression spring 3 includes pressing surfaces 8 and 9 located initially in a preassembled position of the compression spring in depressions 10 and 11 (FIGS. 1 and 2), respectively, such that a funnel-shaped insertion channel, greater than the thickness of flexible circuit 12, is defined between the compression spring and contact element 2 to facilitate insertion of the FFC into a receptacle area 13 in the housing. Receptacle 13 surrounds contact element 2 and is configured in a U-shaped channel to guide the flex circuit during insertion into the connector.

When compression spring 3 is moved from its preassembled position (FIG. 1) to a final mounted position (FIG. 2), pressing surfaces 8 and 9 slide out of depressions 10 and 11 over a slightly raised area and into depressions 14 and 15 where the pressing surfaces exert opposed forces on the backside of the flexible circuit such that mechanical and electrical contact is effected between contact surfaces 16 and 17 of flexible circuit 12 and contact element 2. These pressing forces, produced by the arms of compression spring 3, insure at least a one-sided contact between flexible circuit 12 and contact element 2.

Figure 5:
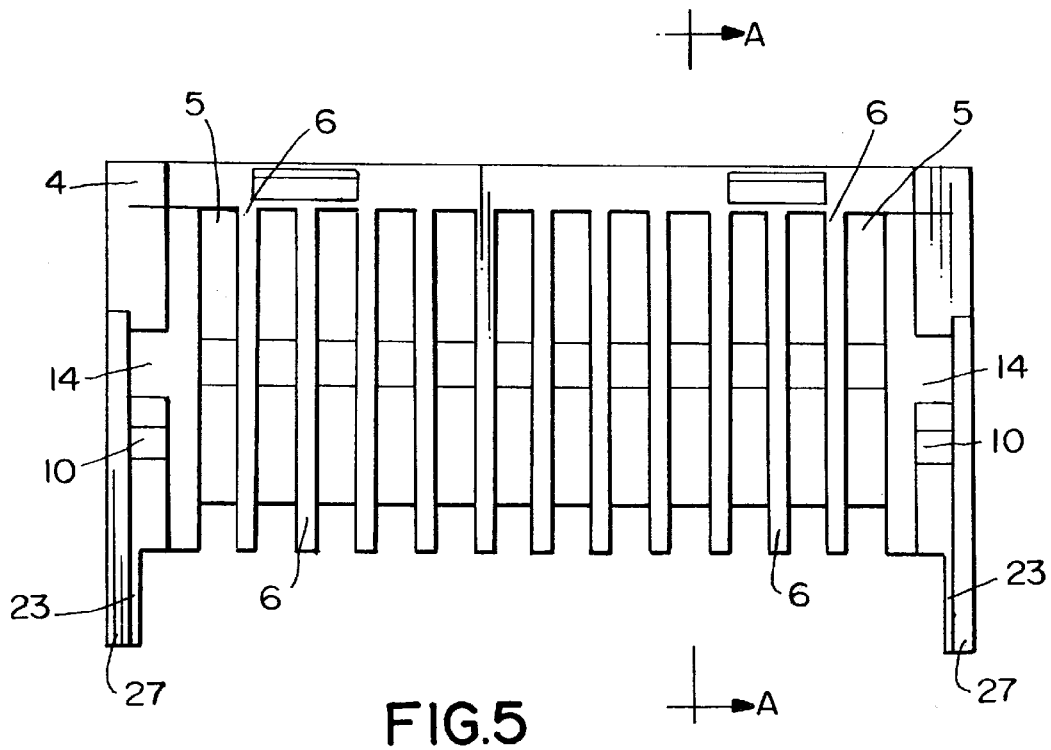
FIG. 5 is a top view of a connector housing of the invention without the compression spring.
Figure 7:
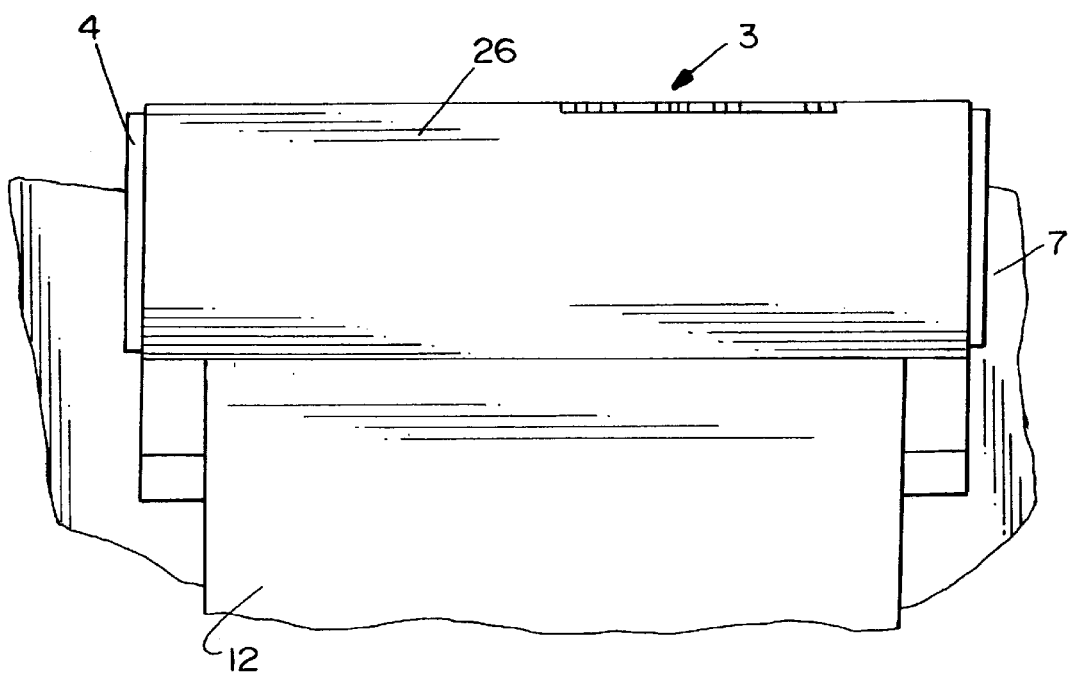
FIG. 7 is a top plan view of a connector according to the invention mounted on a circuit board and including a flexible circuit mounted in the connector.

Compression spring 3, shown in FIG. 7, may be constructed of one-piece spring which has a substantially "omega" shape in cross-section. The spring is seated in its preassembled position in depressions 10 and 11 and the spring is subsequently moved into its final mounted state into depressions 14 and 15, shown in FIG. 2. One embodiment of the connector may include depressions 10 and 11, and 14 and 15 of housing 4 arranged laterally of cavities 5 (FIG. 5). Compression spring 3 may, alternatively, include many slotted arms which respectively enter each cavity 5. These arms would be similarly displaced from their preassembled position in depressions 10 and 11 into the final mounted position in depressions 14 and 15. For reasons of stability, compression spring 3 can be slotted in the region of one leg and can be formed without slots on its opposite side.

In the final mounted state of compression spring 3, strain relief tongues 19 and 20 may extend through corresponding apertures of flexible circuit 12 to provide a strain relief for the flexible circuit. The compression spring may also include corresponding apertures into which tongues 19 and 20 extend in the mounted state (see FIGS. 1 and 2). Tongues 19 and 20 may be formed as an integral portion of housing 4 or as lateral tabs formed on contact elements 2.

Contact element 2 includes a latching tongue or latching element 20 on a first arm thereof which latches into an associated opening of housing 4 and secures the contact element within the housing when contact element 2 is mounted in the housing (FIG. 1). In this position, the second arm of contact element 2 extends into an opening 21 of housing 4, and electrical contact occurs between contact element 2 and a contact surface 22 of circuit board 7. In many applications, the mechanical pressing of contact element 2 against circuit board 7 provides sufficient contact between contact element 2 and circuit board 7. However, in some applications, a solder connection or other known connecting method may be applied to contact element 2 to supplement the mechanical connection, such as screwing, conductive adhesives, crimping, or other method that produces an even more reliable electrical contact in applications where the mechanical pressing alone is insufficient.

Turning now to the assembly and guidance of the compression spring on the housing, housing 4 includes lateral guiding elements 23 in the form of depressions or projections (FIGS. 5 and 6) arranged on, an outer portion of the housing, such as the two guide ribs 27 shown in FIG. 5 which guide the spring into its final mounted position. Ribs 27 extend outwardly from ends of housing 4, and include elements 23 on an inner side thereof extending in the direction of displacement of compression spring 3. The compression spring may include laterally projecting lugs which would engage in and be guided by elongate depressions 26 arranged along the direction of displacement of compression spring 3 such as is depicted in FIG. 6. Alternatively, the compression spring may include the openings which are engaged by the projections 23 of the housing as shown in FIG. 5. Unwanted movements of spring 3 relative to depressions 14 and 15 are thereby minimized, even under relatively high forces. Furthermore, when constructed of a single piece, compression spring 3 can include a unitary spring piece 26 which is mounted unitarily on the housing and includes the pressing surfaces extending therefrom.

Figure 3:
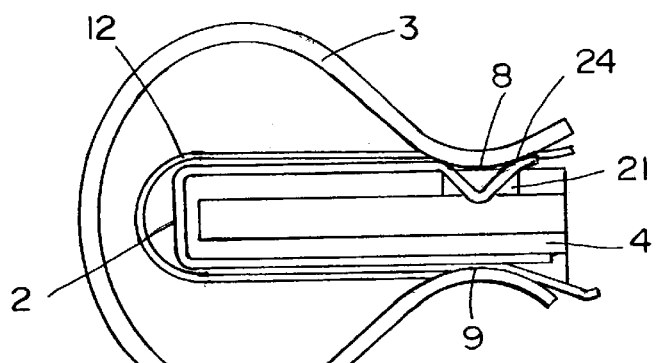
FIG. 3 is a cross section of a first embodiment of the connector according to the invention taken along the line A—A of FIG. 5, showing the compression spring in its mounted position.

Looking now to FIG. 3, contact element 2 can include, instead of or in addition to latching tongue 20, a V-shaped section 24 which penetrates into opening 21 of housing 4. The V-shaped region of contact element 2 allows the flexible circuit to be brought into contact by compression spring 3 in at least two contact areas, and with further contact between pressing surface 9 and flexible circuit 12, three contact areas are effected between flexible circuit 12 and contact element 2.

Figure 4A:
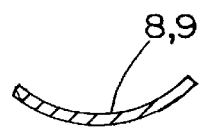
FIG. 4a is a detail of the contact surface of a first compression spring according to the invention.
Figure 4B:
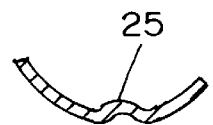
FIG. 4b is a detail of the contact surface of a second compression spring according to the invention, showing two contact regions.

FIG. 4b shows a further embodiment of the invention, wherein a multiple pressing surface 25 is used, in contrast to the single pressing surfaces 8 and 9 shown in FIG. 4a. A double contact between flexible circuit 12 and contact element 2 occurs in at least two areas by means of the double shoulder of pressing surface 25.

Figure 8:
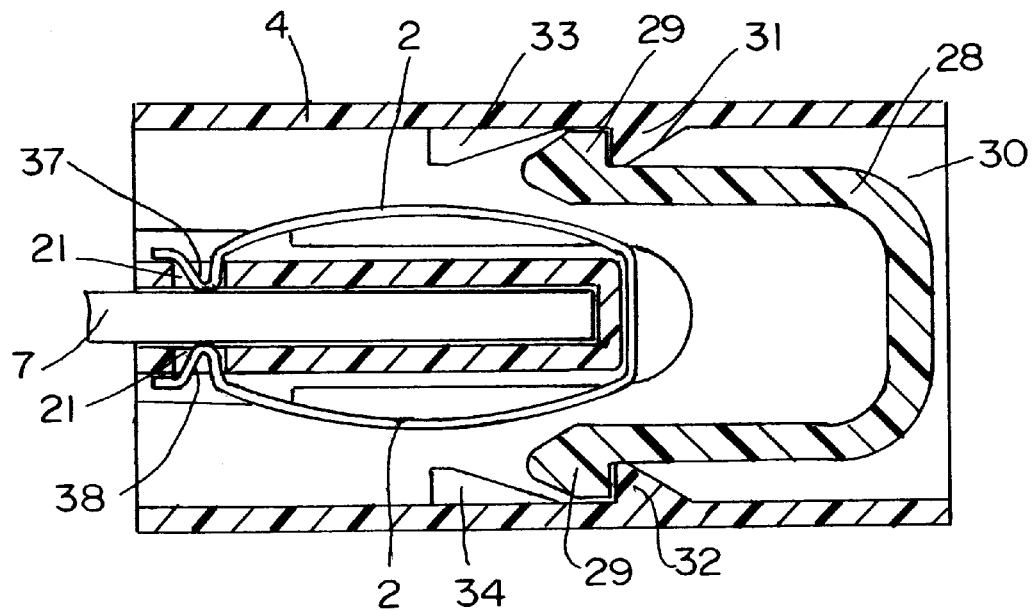
FIG. 8 is a cross section of a further embodiment of a connector according to the invention showing a non-metallic compression spring arranged in its preassembled position.
Figure 9:
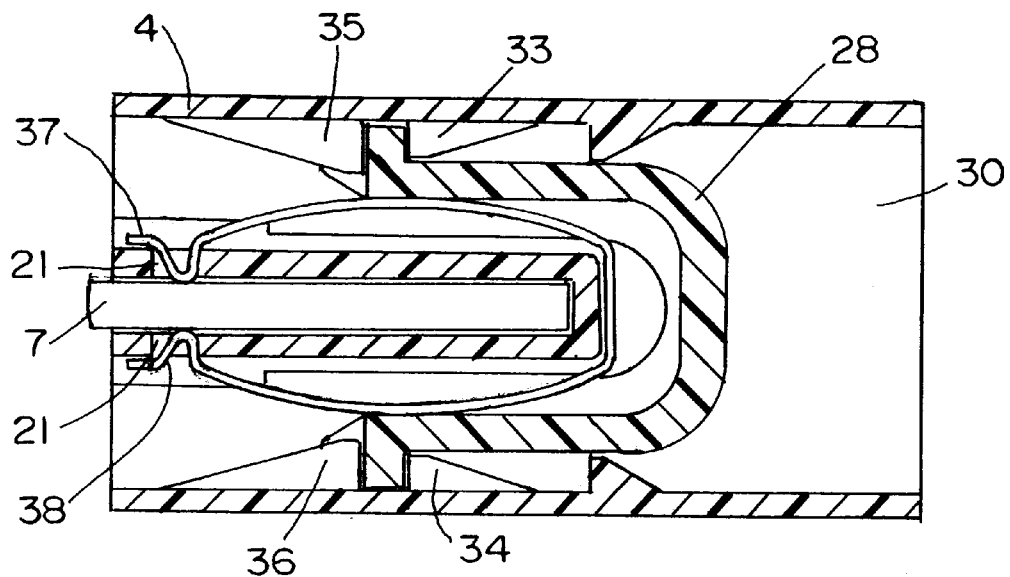
FIG. 9 is a cross section of the connector of FIG. 8 showing the non metallic compression spring arranged in its mounted position.

A cross-sectional view of still a further embodiment according to the invention is shown in FIGS. 8 and 9. Contact elements 2 are shown extending outwardly on each side and are made of a resiliently elastic material. A U-shaped slide 28, preferably consisting of plastic, is provided in place of compression spring 3 and includes latch elements 29 extending laterally from its ends. In this embodiment, housing 4 includes a lateral aperture 30 which has an inside width dimension that corresponds to the dimension of the outer surface of latch elements 29. Instead of depressions 10 and 11, latches 31 and 32 are provided on the inner side of opening 30, and latch elements 29 engage behind them when slide 28 is inserted into the housing. Further latches 33 and 34 are formed on inner side of aperture 30 and define the final mounted position of slide 28, wherein latches 33 and 34 engage latch elements 29 such that a flexible circuit arranged between slide 28 and contact element 2 is reliably pressed against and makes contact with contact clement 2.

As shown in FIG. 9, stops 35 and 36 may be provided which limit the movement of slide 28 in the insertion direction of its final mounted position.

Furthermore, this embodiment includes contact elements 2 having V-shaped latch elements 37 and 38 which latch in openings 21 of housing 4 when the contact element is pushed into the housing.

Although it has been assumed in the preceding description that flexible circuit 12 has contact surfaces 16 and 17 on a single side, the flexible circuit can include contact surfaces on both sides, and can include, for example, conductive surfaces on its backside, i.e., the side remote from contact element 2, connected by compression spring 3 as ground contacts to minimize electrostatic discharges, for example, in the field of sensors for air bags, or in order to provide additional screening.

Furthermore, certain of the compression springs 3 of the backside contact surfaces of flexible circuit 12 may be electrically coupled in order to electrically sense the correct positioning of compression spring 3, to offer additional security for important circuits or to be able to detect erroneous functioning with on-board testing systems of, for example, motor vehicles.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A connector assembly for connecting a printed circuit board and a flat flexible circuit comprising:

a U-shaped housing for receiving an edge of the printed circuit board and including a U-shaped receptacle for receiving the flexible circuit and first and second depressions formed on an outside surface of the housing;

a U-shaped contact element mounted in the housing and adapted to make contact with a contact surface of the printed circuit board and a contact surface of the flexible circuit; and a U-shaped compression spring mounted on the outside of the housing and including pressing surfaces for pressing the flat flexible circuit into contact with the contact element, wherein the compression spring is movable between a preassembled position whereat the pressing surfaces are located in the first depressions of the housing and a final mounted position whereat the pressing surfaces are located in the second depressions of the housing.

2. The connector assembly as set forth in claim 1, wherein the preassembled position of the compression spring allows insertion of the flexible circuit into the housing receptacle and the final mounted position of the compression spring presses the contact surface of the flexible circuit into contact with the contact element.

3. The connector assembly as set forth in claim 1, wherein the preassembled position of the compression spring defines a funnel-shaped insertion channel to facilitate insertion of the flexible circuit into the receptacle of the connector housing.

4. The connector assembly as set forth in claim 1, wherein the housing includes an opening though which an arm of the contact element extends to make contact with the contact surface of the printed circuit board.

5. The connector assembly as set forth in claim 1, wherein the contact clement includes a latching element on one arm thereof which latches into an associated opening of the housing to secure the contact element within the housing.

6. The connector assembly as set forth in claim 1 further including strain relief means which extend through apertures of flexible circuit to provide strain relief for the flexible circuit.

7. The connector assembly as set forth in claim 6 wherein the strain relief means are integrally formed on the housing.

8. The connector assembly as set forth in claim 6 wherein the strain relief means are integrally formed on the contact element.

9. The connector assembly as set forth in claim 1 wherein the compression spring is configured such that its pressing surfaces are located on opposite sides of the spring and exert forces generally opposite one another.

10. The connector assembly as set forth in claim 9 wherein the contact element includes a V-shaped indentation on one of the pressing surfaces to establish two contact points between the contact element and the one pressing surface.

* * * * *